(12) United States Patent
Liaw et al.

(10) Patent No.: US 7,706,201 B2
(45) Date of Patent: Apr. 27, 2010

(54) INTEGRATED CIRCUIT WITH RESISTIVITY CHANGING MEMORY CELLS AND METHODS OF OPERATING THE SAME

(75) Inventors: Corvin Liaw, Munich (DE); Michael Angerbauer, Freutsmoos (DE); Peter Schroegmeier, Munich (DE)

(73) Assignees: Qimonda AG, Munich (DE); ALTIS Semiconductor, SNC, Corbeil Essonnes Cedex (FR)

( * ) Notice: Subject to any disclaimer, the term of this patent is extended or adjusted under 35 U.S.C. 154(b) by 231 days.

(21) Appl. No.: 11/778,549

(22) Filed: Jul. 16, 2007

(65) Prior Publication Data

US 2009/0021976 A1    Jan. 22, 2009

(51) Int. Cl.
*G11C 7/02*    (2006.01)
(52) U.S. Cl. .................... 365/210.1; 365/163; 365/207; 365/208
(58) Field of Classification Search .................. 365/158, 365/163 X, 171, 189.011, 189.15, 207 X, 365/209 X, 210.1, 207, 209, 163
See application file for complete search history.

(56) References Cited

U.S. PATENT DOCUMENTS

| | | | |
|---|---|---|---|
| 6,587,370 B2 * | 7/2003 | Hirai | 365/171 |
| 6,885,579 B2 * | 4/2005 | Sakimura et al. | 365/158 |
| 7,106,623 B2 * | 9/2006 | Hung et al. | 365/163 |
| 7,236,415 B2 * | 6/2007 | Forbes et al. | 365/207 |
| 7,254,052 B2 | 8/2007 | Liaw | |
| 2008/0273370 A1 * | 11/2008 | Keller et al. | 365/148 |

FOREIGN PATENT DOCUMENTS

DE    10 2004 056 911 A1    6/2006

* cited by examiner

*Primary Examiner*—VanThu Nguyen
(74) *Attorney, Agent, or Firm*—Slater & Matsil, L.L.P.

(57) ABSTRACT

An integrated circuit includes a plurality of resistivity changing memory cells and at least one resistivity changing reference cell; a voltage comparator including a first and second input terminals; a signal line connected to the memory cells, the reference cell, and the second input terminal; and a switching element connecting the first input terminal to the second input terminal. A method of operating the integrated circuit includes closing the switching element; supplying a first voltage to the first input terminal via the signal line and the switching element; opening the switching element; supplying a second voltage to the second input terminal via the signal line; and comparing the first and second voltages using the voltage comparator, wherein the first voltage represents a memory state of a memory cell, and the second voltage is a reference voltage which represents a memory state of a reference cell, or vice versa.

24 Claims, 8 Drawing Sheets

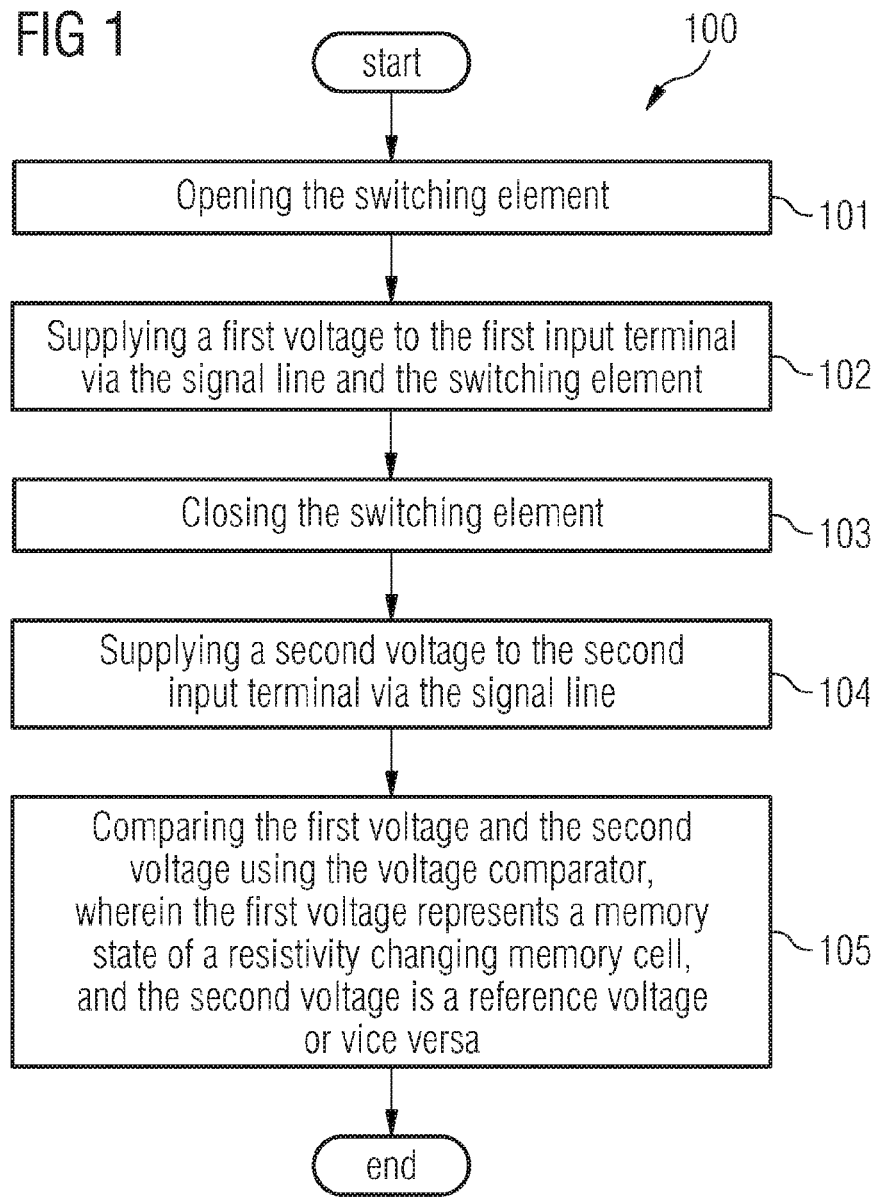
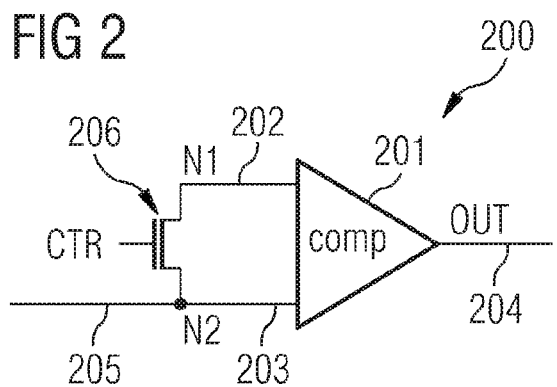

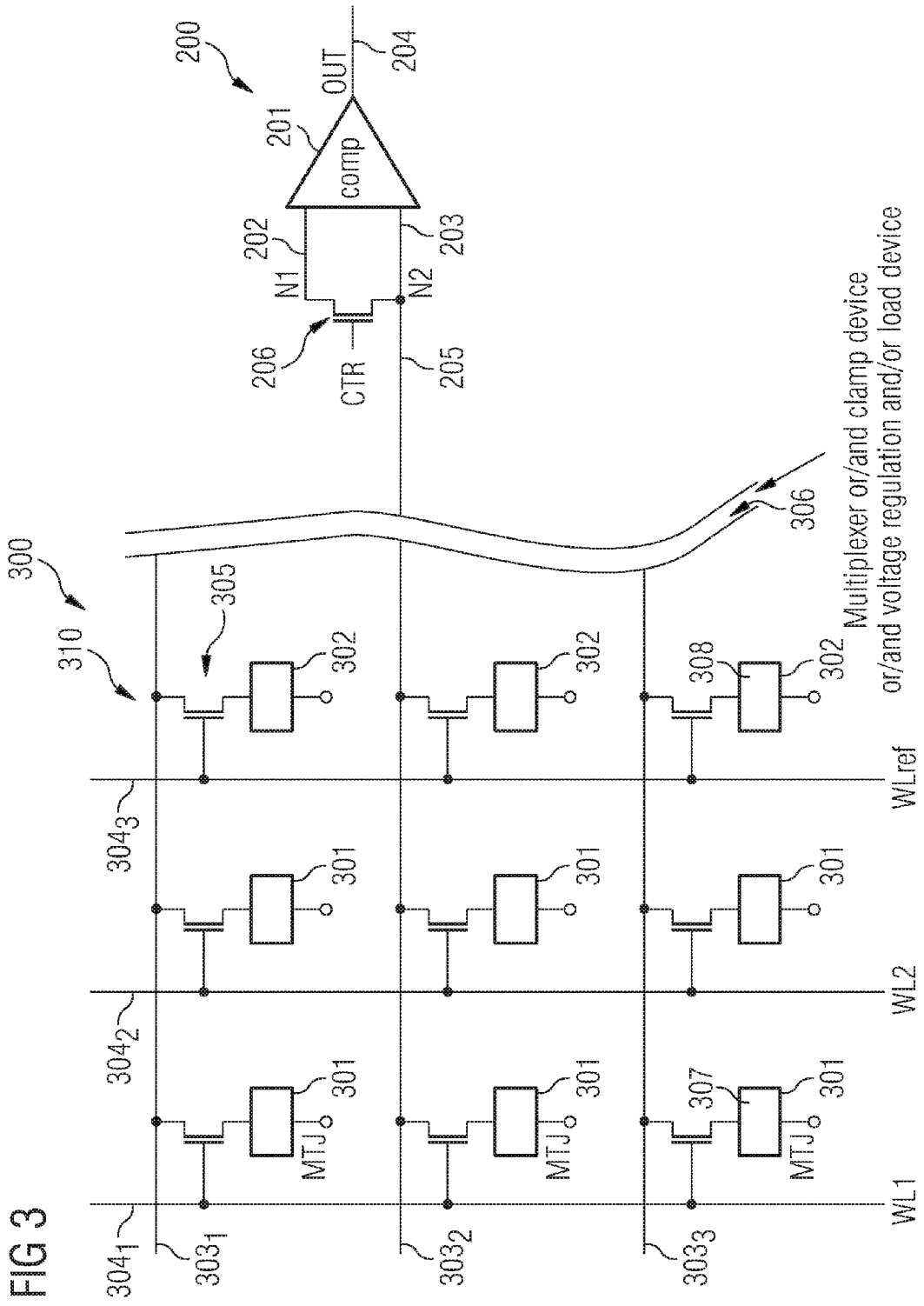

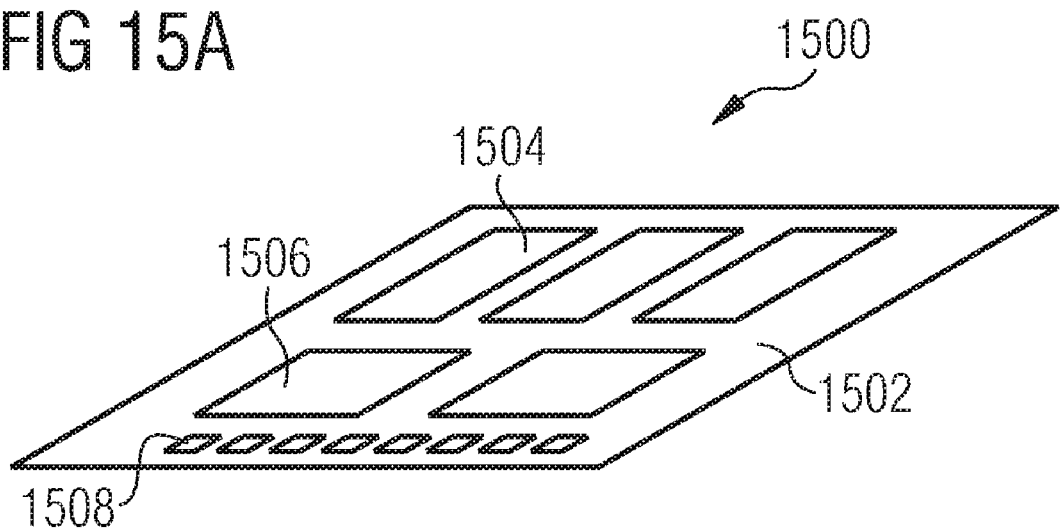
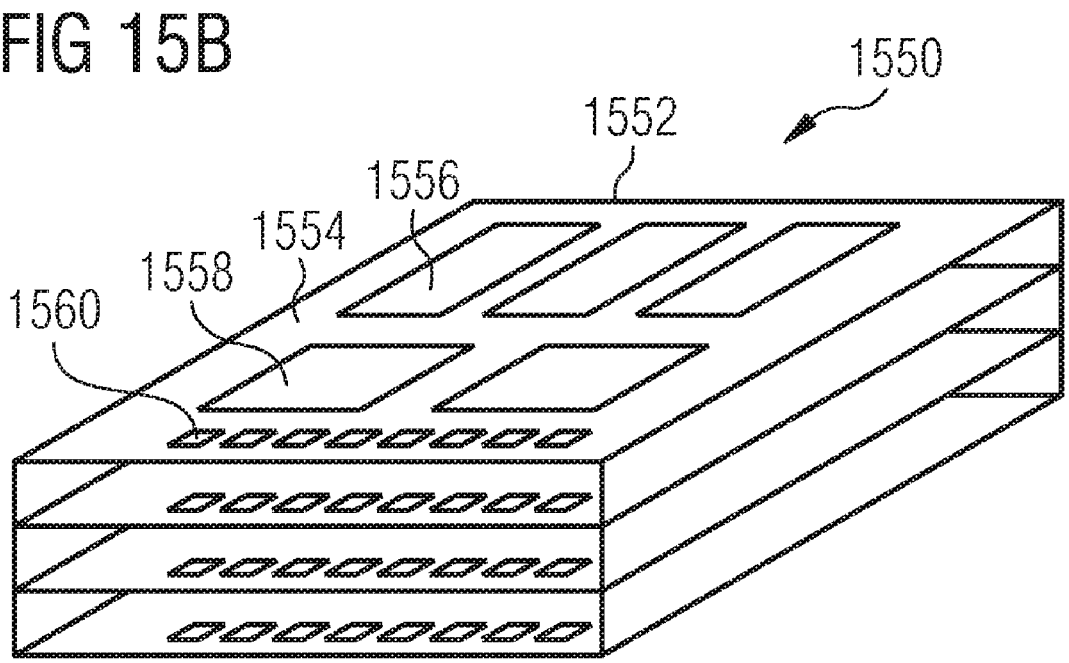

INTEGRATED CIRCUIT WITH RESISTIVITY CHANGING MEMORY CELLS AND METHODS OF OPERATING THE SAME

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a flow chart of a method of operating an integrated circuit according to one embodiment of the present invention;

FIG. 2 shows a part of an integrated circuit according to one embodiment of the present invention;

FIG. 3 shows a part of an integrated circuit according to one embodiment of the present invention;

FIG. 15A shows a schematic drawing of a memory module according to one embodiment of the present invention; and FIG. 15B shows a schematic drawing of a memory module according to one embodiment of the present invention.

DETAILED DESCRIPTION OF ILLUSTRATIVE EMBODIMENTS

Figure 4:
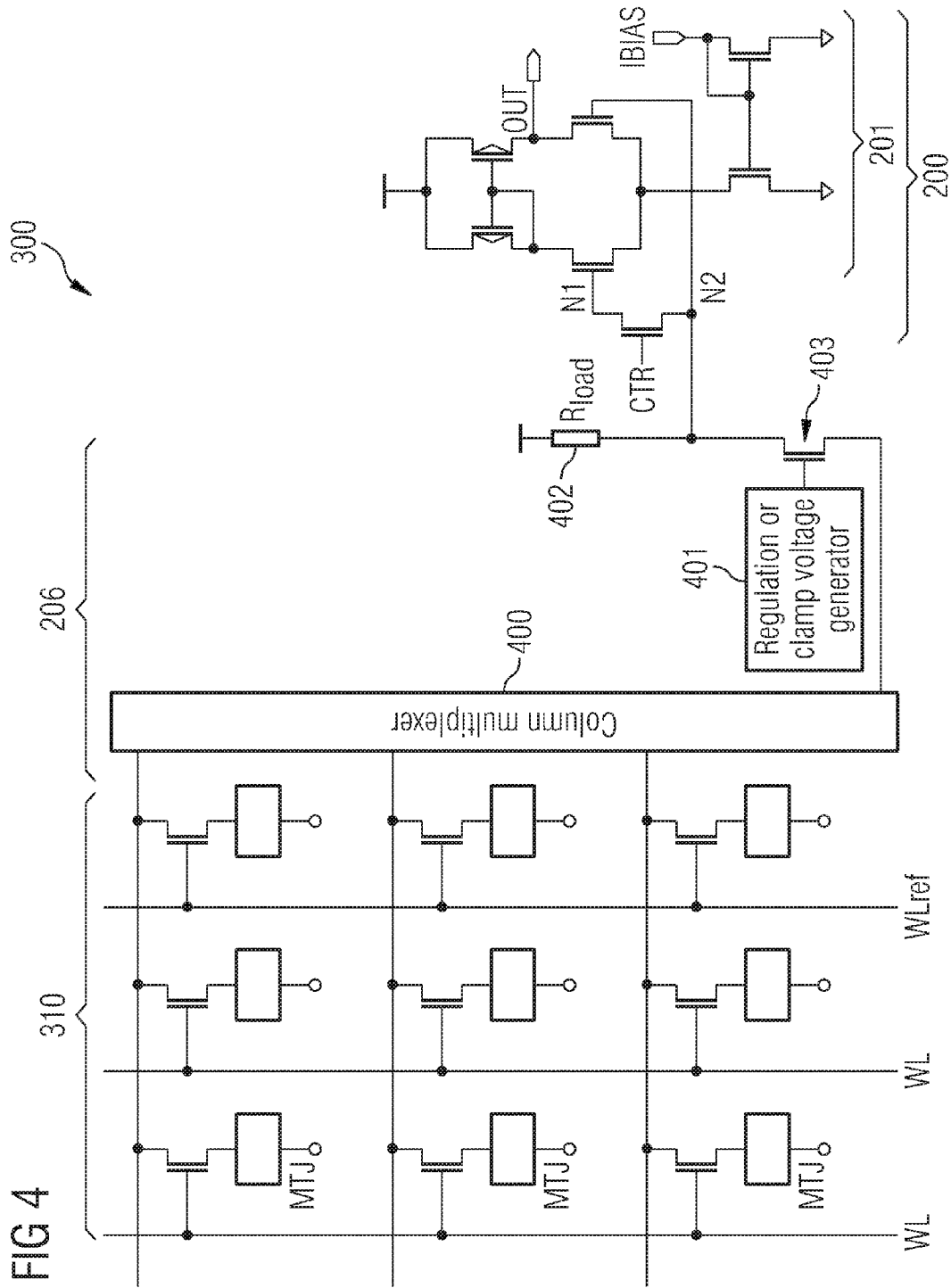
FIG. 4 shows a part of an integrated circuit according to one embodiment of the present invention.

FIG. 1 shows a method 100 of operating an integrated circuit according to one embodiment of the present invention. The integrated circuit includes a plurality of resistivity changing memory cells and at least one resistivity changing reference cell; a voltage comparator including a first input terminal and a second input terminal; a signal line being connected to the plurality of resistivity changing memory cells, the at least one resistivity changing reference cell, and the second input terminal; and a switching element connecting the first input terminal to the second input terminal. At 101, the switching element is opened. At 102, a first voltage is supplied to the first input terminal via the signal line and the switching element. At 103, the switching element is closed. At 104, a second voltage is supplied to the second input terminal via the signal line. At 105, the first voltage and the second voltage are compared against each other using the voltage comparator, wherein the first voltage represents a memory state of a resistivity changing memory cell, and the second voltage is a reference voltage which represents a memory state of a resistivity changing reference cell, or vice versa.

An effect of the operating method 100 is that only one signal line and one switching element are needed in order to provide the first input terminal and the second input terminal of the voltage comparator with different voltage signals. As a consequence, the complexity of the electronic components providing the first input terminal and the second input terminal of the voltage comparator with different voltage signals is low.

According to one embodiment of the present invention, capacitive coupling effects of the switching element are used at 103 in order to change the first voltage supplied by the signal line to the first input terminal to a third voltage, wherein the value of the third voltage differs from the value of the first voltage.

According to one embodiment of the present invention, the third voltage is chosen such that the voltage comparator is capable of detecting a voltage difference between the second voltage and the third voltage. In this way, it is ensured that the voltage comparator is capable of detecting a memory state of a resistivity changing memory cell which is represented by the first voltage even if the first voltage and the second voltage (reference voltage) have the same voltage value.

According to one embodiment of the present invention, the strength of the capacitive coupling effects are controlled by the dimensions and/or electrical properties of the switching element. For example, the strength of the capacitive coupling effects are controlled by the width and the length of the switching element.

According to one embodiment of the present invention, the at least one reference cell has the same physical architecture as that of the memory cells. One effect of this embodiment is that a manufacturing process of the integrated circuit can be simplified since the reference cells and the memory cells can be manufactured using the same processing steps, i.e., no extra processing steps are required for manufacturing the reference cells. A further effect may be that no initial conditioning of the reference cells such as writing or erasing may be required.

According to one embodiment of the present invention, the switching element is a transistor.

According to one embodiment of the present invention, the resistivity changing memory cells are multi-level resistivity changing memory cells, i.e., each resistivity changing memory cell is capable of adopting more than two memory states.

According to one embodiment of the present invention, at 105, the first voltage is compared against several second voltages by keeping the first voltage at the first input terminal constant (the switching element is kept closed), and by varying the second voltage at the second input terminal. According to one embodiment of the present invention, each second voltage supplied to the second input terminal represents a different reference voltage. In this way, multi-level memory state detection can be performed (each second voltage represents a different multi-level reference voltage).

According to one embodiment of the present invention, the reference cells are multi-level resistivity changing reference cells.

According to one embodiment of the present invention, the resistivity changing memory cell and the resistivity changing reference cell are the same cell, wherein the first voltage is obtained by reading out a first memory state (the original memory state) of the cell, and the second voltage is obtained by reprogramming the first memory state of the cell to a second memory state, and reading out the second memory state. Such an operating method is also known as "self-referencing" method (the memory cell itself can also serve as a reference cell, i.e., the memory states of the memory cell are used both for storing memory information and for referencing the stored memory information).

FIG. 2 shows an integrated circuit 200 according to one embodiment of the present invention.

The integrated circuit 200 includes a voltage comparator 201 which includes a first input terminal 202, a second input terminal 203, and an output terminal 204. The integrated circuit 200 further includes a signal line 205 which is connected to the second input terminal 203, and a switching element 206 connecting the first input terminal 202 to the second input terminal 203. Here, the switching element 206 is a n-channel transistor.

As shown in FIG. 3, the integrated circuit 200 may be used within an integrated circuit 300 having a resistivity changing cell array 310 which is connected to the integrated circuit 200. The resistivity changing cell array 310 includes a plurality of resistivity changing memory cells 301 and a plurality of resistivity changing reference cells 302. Here, it is assumed that the resistivity changing memory cells 301 and the resistivity changing reference cells 302 are magneto-resistive cells. However, it is to be understood that the embodiments of the present invention are applicable to arbitrary types of resistivity changing cells like programmable metallization cells (PMCs), phase changing memory cells (e.g., CBRAMs), carbon memory cells, organic cells (e.g., ORAMs), transition oxide cells (TMOs), or the like. The resistivity changing cell array 310 further includes a plurality of bit lines 303 and a plurality of word lines 304. Each resistivity changing memory cell 301 and resistivity changing reference cell 302 is connected to a bitline 303 via a select device 305 (here: a transistor), wherein the select device 305 is controlled by one of the word lines 304. The signal line 205 is connected to the resistivity changing cell array 310 via a distribution circuit 306 which may, for example, include multiplexers and/or clamp devices and/or voltage regulation devices and/or node devices.

According to one embodiment of the present invention, the integrated circuit 300 is configured to carry out the following processes: a) closing the switching element 206, b) supplying a first voltage to the first input terminal 202 via the signal line 205 and the switching element 206, c) opening the switching element 206, d) supplying a second voltage to the second input terminal 203 via the signal line 205, and e) comparing the first voltage and the second voltage using the voltage comparator 201, wherein the first voltage represents a memory state of a resistivity changing memory cell (for example, the resistivity changing memory cell 301), and the second voltage is a reference voltage which represents a memory state of a resistivity changing reference cell (for example, the resistivity changing reference cell 302), or vice versa.

According to one embodiment of the present invention, capacitive coupling properties of the switching element 206 are used in order to change the first voltage supplied by the signal line 205 to the first input terminal 202 to a third voltage, wherein the value of the third voltage differs from the value of the first voltage. For example, the capacitive coupling properties of the switching element 206 may be used such that the first voltage supplied via the signal line 205 is increased in its value or is decreased in its value. One effect of this embodiment is that it is possible to sense the memory state of a resistivity changing memory cell 301 (which is reflected by the value of the first voltage) even if a reference voltage (second voltage) is used having the same voltage value as the voltage value of the first voltage. As a consequence, it is possible to use resistivity changing reference cells 302 having the same architecture (and thus the same resistance levels) as that of the resistivity changing memory cells 301.

For example, it is assumed that a first voltage reflecting the memory state of a resistivity changing memory cell 301 denoted by reference numeral 307 is supplied to the first input terminal 202, wherein the resistivity changing memory cell 307 is in the resistive (high ohmic) state. In order to do this, the switching element 206 is switched into the conductive state. Then, a second voltage reflecting the memory state of the resistivity changing reference cell 302 denoted by reference numeral 308 is supplied to the second input terminal 203 after having switched the switching element 206 from the conductive state to the resistive state. It is assumed that the memory state of a resistivity changing reference cell 308 is in the same memory state as the memory state of a resistivity changing memory cell 307, i.e., in the resistive state. As a consequence, the first voltage is identical to the second voltage. Under normal circumstances it would not be possible to use the memory state of a resistivity changing reference cell 308 in order to determine the memory state of the resistivity changing memory cell 307. However, due to capacitive coupling effects of the switching element 206 which occur when the switching element 206 is switched from the conductive state to the resistive state after having supplied the first voltage to the first input terminal 202, the first voltage is changed to a third voltage which shows an increased or decreased voltage value, compared to the first voltage (depending on the design of the switching element 206). In this way, the voltage comparator 201 is capable of sensing a voltage difference between the third voltage and the second voltage, thereby sensing the memory state of the resistivity changing memory cell 307. The same holds true if both the memory state of a resistivity changing memory cell 307 and the memory state of a resistivity changing reference cell 308 are in the conductive state (low resistance state). In other words: the necessary voltage difference needed by the voltage comparator 201 can be artificially generated if there is no voltage difference.

According to one embodiment of the present invention, instead of using a resistivity changing reference cell (e.g., the resistivity changing reference cell 302) in order to generate the second voltage (reference voltage), also the resistivity changing memory cell (e.g., the resistivity changing memory cell 301) to be read out itself may be used as resistivity changing reference cell: In this case, for example, after having supplied the first voltage reflecting the memory state 307 of the resistivity changing memory cell 301 to the first input terminal 202, the resistivity changing memory cell 301 is reprogrammed to one of the resistive state and the conductive state (i.e., is either reprogrammed to the resistive state or the conductive state). Then, the second voltage is generated by reading the memory state of the resistivity changing memory cell 307 and compared with the first voltage (to be more exactly: the third voltage). Then, the memory state 307 of the resistivity changing memory cell 301 is reprogrammed to the other one of the conductive state and the resistive state (i.e. is either reprogrammed to the resistive state or the conductive state). Then, the memory state of the resistivity changing memory cell 307 again is read, thereby generating a further second voltage which is compared with the first voltage (to be more exact, the third voltage). It is to be understood that the last two processes (the memory state of the resistivity changing memory cell 307 is reprogrammed to the other one of the conductive state and the resistive state; the memory state of the resistivity changing memory cell 307 again is read, thereby generating a further second voltage which is compared with the first voltage) may also be omitted, depending on the results of the processes carried out before. In this way, the memory state of the resistivity changing memory cell 307 can be determined. After having determined the memory state, the resistivity changing memory cell 301 may be reprogrammed to the memory state which has been determined.

FIG. 4 shows a possible embodiment of the distribution circuit 306 shown in FIG. 3. The distribution circuit 306 includes a column multiplexer 400, a voltage regulation/clamp voltage generator 401, a load device 402, and a transistor 403 which is connected to the regulation/clamp voltage generator 401 and the load device 402. Further, a possible embodiment of the voltage comparator 201 is shown.

Figure 5:
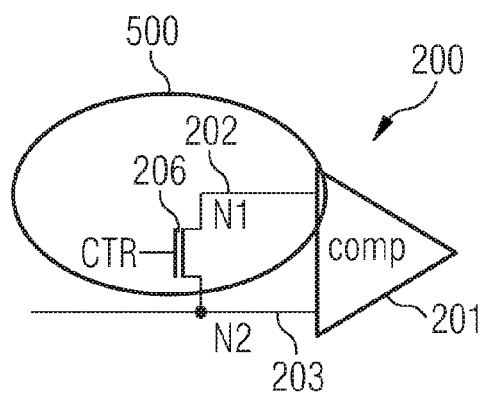
FIG. 5 shows an equivalent circuit of a part of the integrated circuit shown in FIG. 4.
Figure 6:
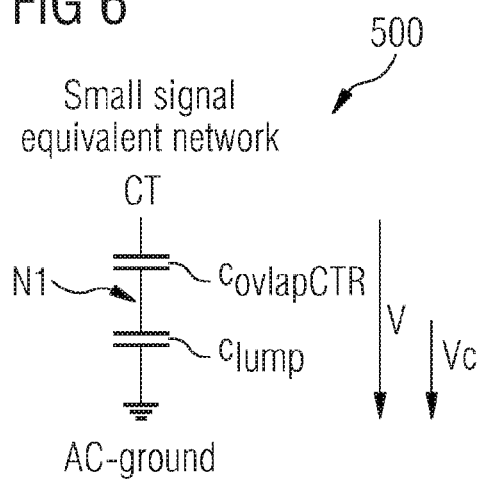
FIG. 6 shows a part of an integrated circuit according to one embodiment of the present invention.

In FIG. 5, a part of the integrated circuit 200 shown in FIG. 2 is denoted by reference numeral 500. FIG. 6 shows a small signal equivalent circuit of the part 500 shown in FIG. 5. As can be derived from FIG. 6, the switching element 206 has an "overlap" capacity ($c_{ovlapCTR}$), and the first input terminal 202 has a capacity ($c_{lump}$) against ground. These two capacities are connected in series.

As already indicated before, according to one embodiment of the present invention, the overlap capacity is adjusted such (by adjusting the physical architecture/electrical properties of the switching element 206) that the first voltage supplied to the first input terminal 202 is shifted by a corresponding voltage offset (due to $c_{ovlapCTR}$) as soon as the switching element 206 switches from the conductive state to the resistive state, thereby generating a third voltage at the first input terminal 202.

Figure 7:
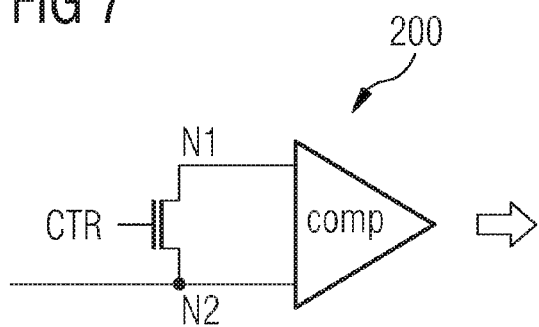
FIG. 7 shows a part of an integrated circuit according to one embodiment of the present invention.
Figure 8:
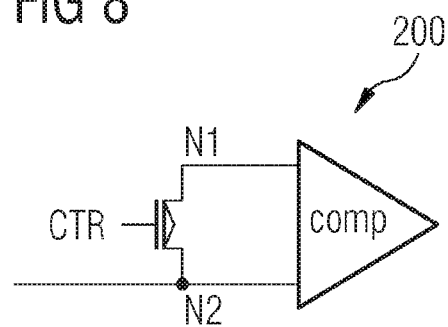
FIG. 8 shows a part of an integrated circuit.

As indicated in FIGS. 7 and 8, the effect of shifting the first voltage may be obtained using n-channel transistor switching elements (FIG. 7) and p-channel transistor switching elements (FIG. 8), wherein the use of an n-channel transistor results in an opposite voltage shift compared to the use of an p-channel transistor. The use of n-channel transistors or p-channel transistors may be chosen in dependence on the "default memory state" (e.g., either conductive memory state or resistive memory state) of the resistivity changing memory cells/reference cells. A p-channel transistor is conductive at low voltages and becomes non-conductive using controlling signals having rising edges. A n-channel transistor is conductive at high voltages and becomes non-conductive using controlling signals having falling edges.

Figure 9:
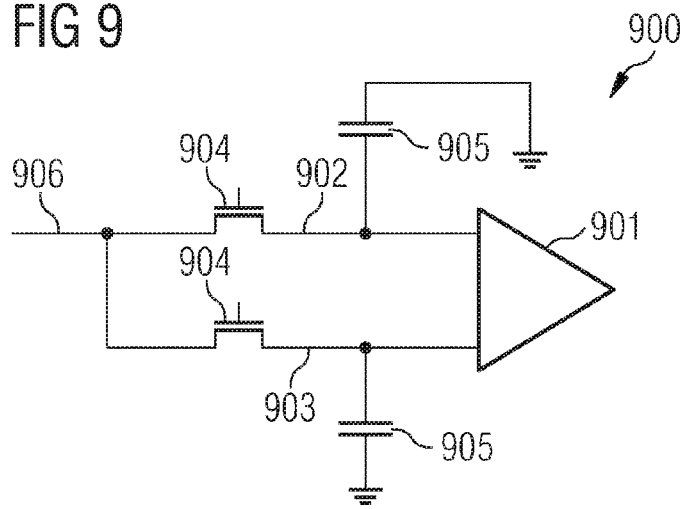
FIG. 9 shows a part of an integrated circuit according to one embodiment of the present invention.

FIG. 9 shows an integrated circuit 900 including a voltage comparator 901 including a first input terminal 902 and a second input terminal 903, wherein the first input terminal 902 and the second input terminal 903 are connected to a signal line 906 via corresponding switching elements 904. Further, the first input terminal 902 and the second input terminal 903 are connected to ground via corresponding capacities 905, respectively. The integrated circuit 900 may be used for the same purpose as the integrated circuit 200 which has been described above. However, two switching elements 904 are necessary in order to supply respective voltages to the first input terminal 902 and the second input terminal 903. As a consequence, more components/more space is needed for realizing integrated circuit 900, compared to integrated circuit 200.

According to one embodiment of the present invention, the resistivity changing memory cells are programmable metallization cell cells (PMC) (e.g., solid electrolyte cells like CBRAM (conductive bridging random access memory) cells). Therefore, in the following description, making reference to FIGS. 10A and 10B, a basic principle underlying embodiments of CBRAM devices will be explained.

Figures 10A, 10B:
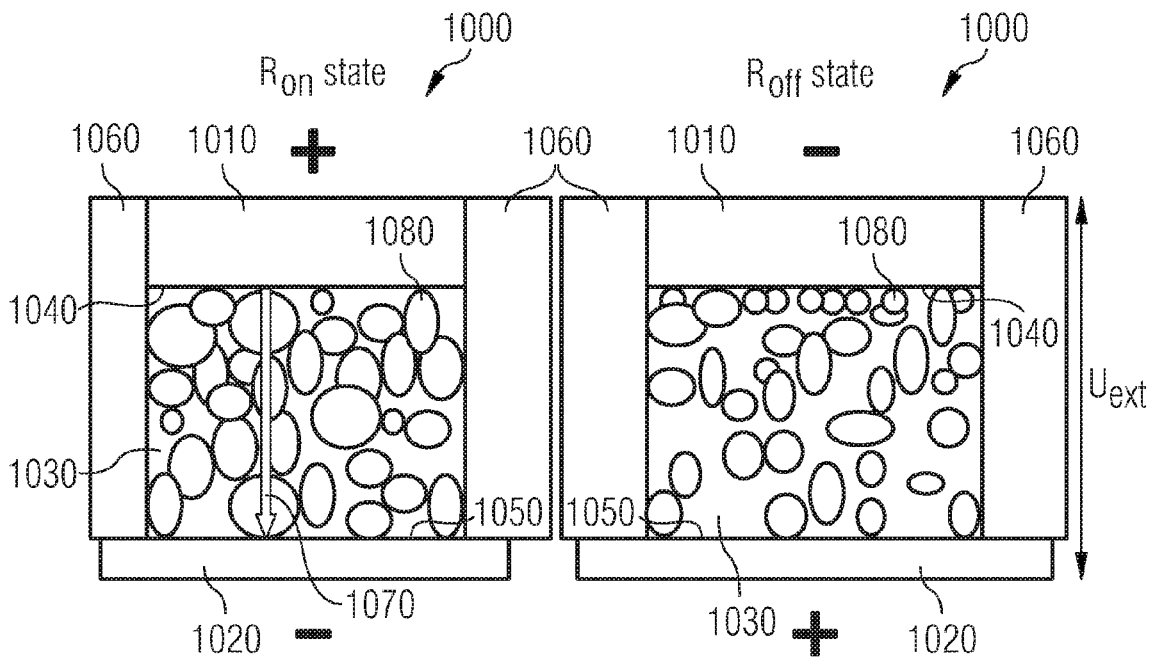
FIG. 10a shows a schematic cross-sectional view of a programmable metallization memory cell set to a first switching state.
FIG. 10b shows a schematic cross-sectional view of a programmable metallization memory cell set to a second switching state.

As shown in FIG. 10A, a CBRAM cell 1000 includes a first electrode 1010, a second electrode 1020, and a solid electrolyte block (in the following also referred to as ion conductor block) 1030 which includes the active material and which is sandwiched between the first electrode 1010 and the second electrode 1020. This solid electrolyte block 1030 can also be shared between a plurality of memory cells (not shown here). The first electrode 1010 contacts a first surface 1040 of the ion conductor block 1030, the second electrode 1020 contacts a second surface 1050 of the ion conductor block 1030. The ion conductor block 1030 is isolated against its environment by an isolation structure 1060. The first surface 1040 usually is the top surface, the second surface 1050 the bottom surface of the ion conductor 1030. In the same way, the first electrode 1010 generally is the top electrode, and the second electrode 1020 the bottom electrode of the CBRAM cell. One of the first electrode 1010 and the second electrode 1020 is a reactive electrode, the other one an inert electrode. Here, the first electrode 1010 is the reactive electrode, and the second electrode 1020 is the inert electrode. In this example, the first electrode 1010 includes silver (Ag), the ion conductor block 1030 includes silver-doped chalcogenide material, the second electrode 1020 includes tungsten (W), and the isolation structure 1060 includes $SiO_2$ or $Si_3N_4$. The present invention is however not restricted to these materials. For example, the first electrode 1010 may alternatively or additionally include copper (Cu) or zinc (Zn), and the ion conductor block 1030 may alternatively or additionally include copper-doped chalcogenide material. Further, the second electrode 1020 may alternatively or additionally include nickel (Ni) or platinum (Pt), iridium (Ir), rhenium (Re), tantalum (Ta), titanium (Ti), ruthenium (Ru), molybdenum (Mo), vanadium (V), conductive oxides, silicides, and nitrides of the aforementioned materials, and can also include alloys of the aforementioned materials. The thickness of the ion conductor 1030 may, for example, range between 5 nm and 500 nm. The thickness of the first electrode 1010 may, for example, range between 10 nm and 100 nm. The thickness of the second electrode 1020 may, for example, range between 5 nm and 500 nm, between 15 nm to 150 nm, or between 25 nm and 100 nm. It is to be understood that the present invention is not restricted to the above-mentioned materials and thicknesses.

In the context of this description, chalcogenide material (ion conductor) is to be understood, for example, as any compound containing oxygen, sulphur, selenium, germanium and/or tellurium. In accordance with one embodiment of the invention, the ion conducting material is, for example, a compound, which is made of a chalcogenide and at least one metal of the group I or group II of the periodic system, for example, arsenic-trisulfide-silver. Alternatively, the chalcogenide material contains germanium-sulfide ($GeS_x$), germanium-selenide ($GeSe_x$), tungsten oxide ($WO_x$), copper sulfide ($CuS_x$) or the like. The ion conducting material may be a solid state electrolyte. Furthermore, the ion conducting material can be made of a chalcogenide material containing metal ions, wherein the metal ions can be made of a metal, which is selected from a group consisting of silver, copper and zinc or of a combination or an alloy of these metals.

If a voltage as indicated in FIG. 10A is applied across the ion conductor block 1030, a redox reaction is initiated which drives Ag$^+$ ions out of the first electrode 1010 into the ion conductor block 1030 where they are reduced to Ag, thereby forming Ag rich clusters 1080 within the ion conductor block 1030. If the voltage applied across the ion conductor block 1030 is applied for an enhanced period of time, the size and the number of Ag rich clusters within the ion conductor block 1030 is increased to such an extent that a conductive bridge 1070 between the first electrode 1010 and the second electrode 1020 is formed. In case that a voltage is applied across the ion conductor 1030 as shown in FIG. 10B (inverse voltage compared to the voltage applied in FIG. 10A), a redox reaction is initiated which drives Ag$^+$ ions out of the ion conductor block 1030 into the first electrode 1010 where they are reduced to Ag. As a consequence, the size and the number of Ag rich clusters within the ion conductor block 103 is reduced, thereby erasing the conductive bridge 1070. After having applied the voltage/inverse voltage, the memory cell 1000 remains within the corresponding defined switching state even if the voltage/inverse voltage has been removed.

In order to determine the current memory status of a CBRAM cell, for example, a sensing current is routed through the CBRAM cell. The sensing current experiences a high resistance in case no conductive bridge 1070 exists within the CBRAM cell, and experiences a low resistance in case a conductive bridge 1070 exists within the CBRAM cell. A high resistance may, for example, represent "0", whereas a low resistance represents "1", or vice versa. The memory status detection may also be carried out using sensing voltages. Alternatively, a sensing voltage may be used in order to determine the current memory status of a CBRAM cell.

According to one embodiment of the invention, the resistivity changing memory cells are phase changing memory cells that include a phase changing material. The phase changing material can be switched between at least two different crystallization states (i.e., the phase changing material may adopt at least two different degrees of crystallization), wherein each crystallization state may be used to represent a memory state. When the number of possible crystallization states is two, the crystallization state having a high degree of crystallization is referred to as "crystalline state", whereas the crystallization state having a low degree of crystallization is referred to as an "amorphous state". Different crystallization states can be distinguished from each other by their differing electrical properties, and in particular by their different resistances. For example, a crystallization state having a high degree of crystallization (ordered atomic structure) generally has a lower resistance than a crystallization state having a low degree of crystallization (disordered atomic structure). For sake of simplicity, it will be assumed in the following that the phase changing material can adopt two crystallization states (an "amorphous state" and a "crystalline state"), however it will be understood that additional intermediate states may also be used.

Phase changing memory cells may change from the amorphous state to the crystalline state (and vice versa) due to temperature changes of the phase changing material. These temperature changes may be caused using different approaches. For example, a current may be driven through the phase changing material (or a voltage may be applied across the phase changing material). Alternatively, a current or a voltage may be fed to a resistive heater which is disposed adjacent to the phase changing material. To determine the memory state of a resistivity changing memory cell, a sensing current may routed through the phase changing material (or a sensing voltage may be applied across the phase changing material), thereby sensing the resistivity of the resistivity changing memory cell, which represents the memory state of the memory cell.

Figure 11:
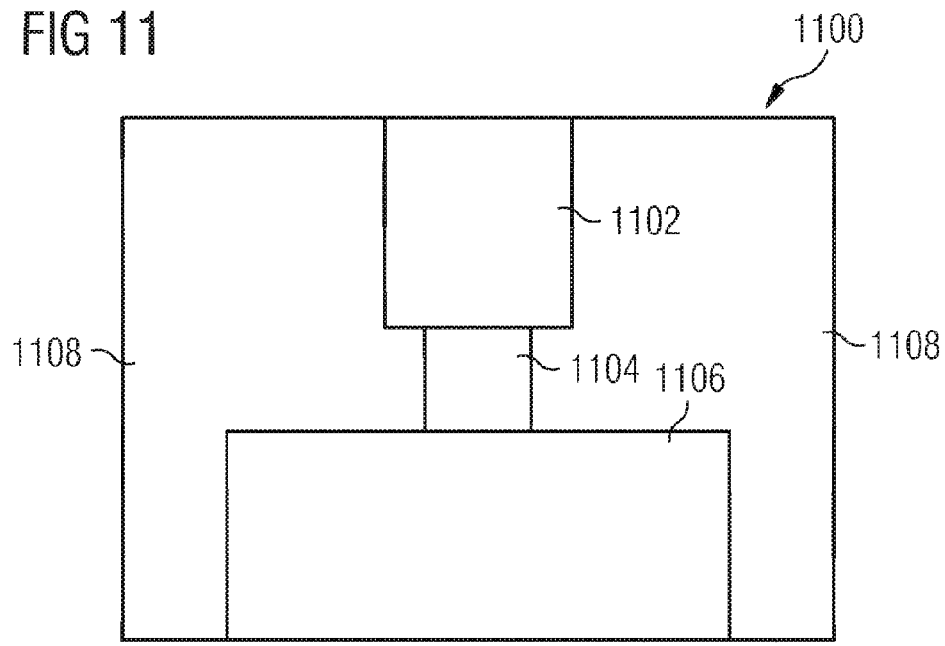
FIG. 11 shows a cross-sectional view of a phase changing memory cell.

FIG. 11 illustrates a cross-sectional view of an exemplary phase changing memory cell 1100 (active-in-via type). The phase changing memory cell 1100 includes a first electrode 1102, a phase changing material 1104, a second electrode 1106, and an insulating material 1108. The phase changing material 1104 is laterally enclosed by the insulating material 1108. To use the phase changing memory cell, a selection device (not shown), such as a transistor, a diode, or another active device, may be coupled to the first electrode 1102 or to the second electrode 1106 to control the application of a current or a voltage to the phase changing material 1104 via the first electrode 1102 and/or the second electrode 1106. To set the phase changing material 1104 to the crystalline state, a current pulse and/or voltage pulse may be applied to the phase changing material 1104, wherein the pulse parameters are chosen such that the phase changing material 1104 is heated above its crystallization temperature, while keeping the temperature below the melting temperature of the phase changing material 1104. To set the phase changing material 1104 to the amorphous state, a current pulse and/or voltage pulse may be applied to the phase changing material 1104, wherein the pulse parameters are chosen such that the phase changing material 1104 is quickly heated above its melting temperature, and is quickly cooled.

The phase changing material 1104 may include a variety of materials. According to one embodiment, the phase changing material 1104 may include or consist of a chalcogenide alloy that includes one or more elements from group VI of the periodic table. According to another embodiment, the phase changing material 1104 may include or consist of a chalcogenide compound material, such as GeSbTe, SbTe, GeTe or AgInSbTe. According to a further embodiment, the phase changing material 1104 may include or consist of chalcogen free material, such as GeSb, GaSb, InSb, or GeGaInSb. According to still another embodiment, the phase changing material 1104 may include or consist of any suitable material including one or more of the elements Ge, Sb, Te, Ga, Bi, Pb, Sn, Si, P, O, As, In, Se, and S.

According to one embodiment, at least one of the first electrode 1102 and the second electrode 1106 may include or consist of Ti, V, Cr, Zr, Nb, Mo, Hf, Ta, W, or mixtures or alloys thereof. According to another embodiment, at least one of the first electrode 1102 and the second electrode 1106 may include or consist of Ti, V, Cr, Zr, Nb, Mo, Hf, Ta, W and two or more elements selected from the group consisting of B, C, N, O, Al, Si, P, S, and/or mixtures and alloys thereof. Examples of such materials include TiCN, TiAlN, TiSiN, W—Al$_2$O$_3$ and Cr—Al$_2$O$_3$.

Figure 12:
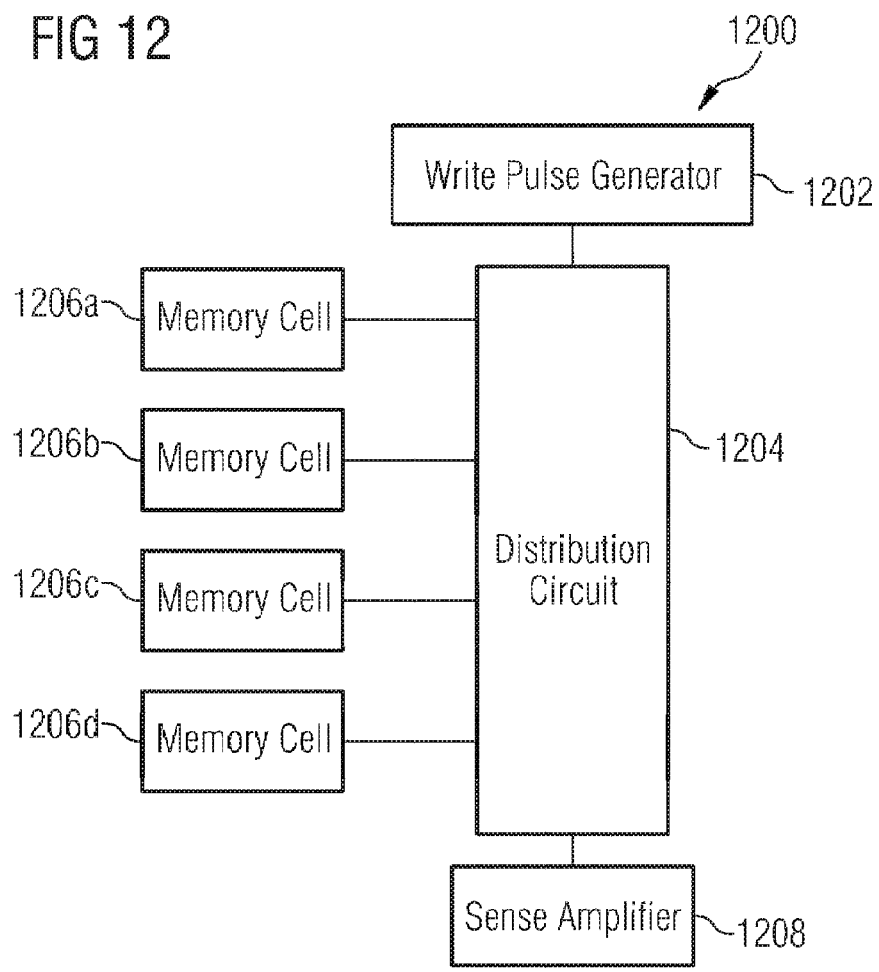
FIG. 12 shows a schematic drawing of a memory device including resistivity changing memory cells.

FIG. 12 illustrates a block diagram of a memory device 1200 including a write pulse generator 1202, a distribution circuit 1204, phase changing memory cells 1206a, 1206b, 1206c, 1206d (for example, phase changing memory cells 1100 as shown in FIG. 11), and a sense amplifier 1208. According to one embodiment, the write pulse generator 1202 generates current pulses or voltage pulses that are supplied to the phase changing memory cells 1206a, 1206b, 1206c, 1206d via the distribution circuit 1204, thereby programming the memory states of the phase changing memory cells 1206a, 1206b, 1206c, 1206d. According to one embodiment, the distribution circuit 1204 includes a plurality of transistors that supply direct current pulses or direct voltage pulses to the phase changing memory cells 1206a, 1206b,

1206c, 1206d or to heaters being disposed adjacent to the phase changing memory cells 1206a, 1206b, 1206c, 1206d. The architecture shown in FIG. 12 can also be applied to memory devices having other types of resistivity changing memory cells.

As already indicated, the phase changing material of the phase changing memory cells 1206a, 1206b, 1206c, 1206d may be changed from the amorphous state to the crystalline state (or vice versa) under the influence of a temperature change. More generally, the phase changing material may be changed from a first degree of crystallization to a second degree of crystallization (or vice versa) under the influence of a temperature change. For example, a bit value "0" may be assigned to the first (low) degree of crystallization, and a bit value "1" may be assigned to the second (high) degree of crystallization. Since different degrees of crystallization imply different electrical resistances, the sense amplifier 1208 is capable of determining the memory state of one of the phase changing memory cells 1206a, 1206b, 1206c, or 1206d in dependence on the resistance of the phase changing material.

To achieve high memory densities, the phase changing memory cells 1206a, 1206b, 1206c, 1206d may be capable of storing multiple bits of data, i.e., the phase changing material may be programmed to more than two resistance values. For example, if a phase changing memory cell 1206a, 1206b, 1206c, 1206d is programmed to one of three possible resistance levels, 1.5 bits of data per memory cell can be stored. If the phase changing memory cell is programmed to one of four possible resistance levels, two bits of data per memory cell can be stored, and so on.

The embodiment shown in FIG. 12 may also be applied in a similar manner to other types of resistivity changing memory cells like programmable metallization cells (PMCs), magento-resistive memory cells (e.g., MRAMs), organic memory cells (e.g., ORAMs), or transition oxide memory cells (TMOs).

Another type of resistivity changing memory cell may be formed using carbon as a resistivity changing material. Generally, amorphous carbon that is rich in $sp^3$-hybridized carbon (i.e., tetrahedrally bonded carbon) has a high resistivity, while amorphous carbon that is rich in $sp^2$-hybridized carbon (i.e., trigonally bonded carbon) has a low resistivity. This difference in resistivity can be used in a resistivity changing memory cell.

In one embodiment, a carbon memory cell may be formed in a manner similar to that described above with reference to phase changing memory cells. A temperature-induced change between an $sp^3$-rich state and an $sp^2$-rich state may be used to change the resistivity of an amorphous carbon material. These differing resistivities may be used to represent different memory states. For example, a high resistance $sp^3$-rich state can be used to represent a "0", and a low resistance $sp^2$-rich state can be used to represent a "1". It will be understood that intermediate resistance states may be used to represent multiple bits, as discussed above.

Generally, in this type of carbon memory cell, application of a first temperature causes a change of high resistivity $sp^3$-rich amorphous carbon to relatively low resistivity $sp^2$-rich amorphous carbon. This conversion can be reversed by application of a second temperature, which is typically higher than the first temperature. As discussed above, these temperatures may be provided, for example, by applying a current and/or voltage pulse to the carbon material. Alternatively, the temperatures can be provided by using a resistive heater that is disposed adjacent to the carbon material.

Another way in which resistivity changes in amorphous carbon can be used to store information is by field-strength induced growth of a conductive path in an insulating amorphous carbon film. For example, applying voltage or current pulses may cause the formation of a conductive $sp^2$ filament in insulating $sp^3$-rich amorphous carbon. The operation of this type of resistive carbon memory is illustrated in FIGS. 13A and 13B.

Figure 13A:
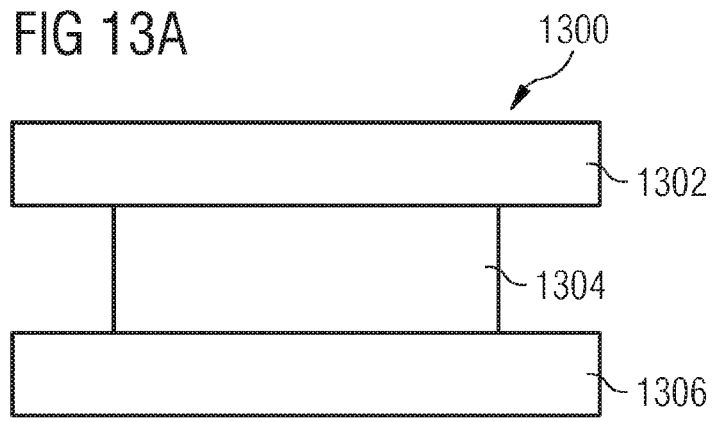
FIG. 13A shows a cross-sectional view of a carbon memory cell set to a first switching state.
Figure 13B:
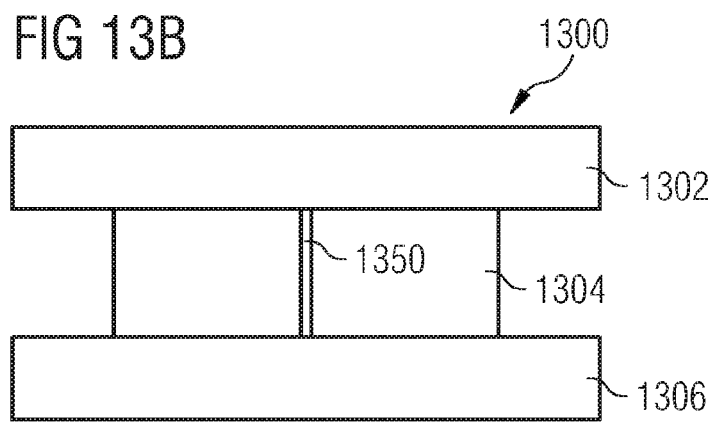
FIG. 13B shows a cross-sectional view of a carbon memory cell set to a second switching state.

FIG. 13A shows a carbon memory cell 1300 that includes a top contact 1302, a carbon storage layer 1304 including an insulating amorphous carbon material rich in $sp^3$-hybridized carbon atoms, and a bottom contact 1306. As shown in FIG. 13B, by forcing a current (or voltage) through the carbon storage layer 1304, an $sp^2$ filament 1350 can be formed in the $sp^3$-rich carbon storage layer 1304, changing the resistivity of the memory cell. Application of a current (or voltage) pulse with higher energy (or, in some embodiments, reversed polarity) may destroy the $sp^2$ filament 1350, increasing the resistance of the carbon storage layer 1304. As discussed above, these changes in the resistance of the carbon storage layer 1304 can be used to store information, with, for example, a high resistance state representing a "0" and a low resistance state representing a "1". Additionally, in some embodiments, intermediate degrees of filament formation or formation of multiple filaments in the $sp^3$-rich carbon film may be used to provide multiple varying resistivity levels, which may be used to represent multiple bits of information in a carbon memory cell. In some embodiments, alternating layers of $sp^3$-rich carbon and $sp^2$-rich carbon may be used to enhance the formation of conductive filaments through the $sp^3$-rich layers, reducing the current and/or voltage that may be used to write a value to this type of carbon memory.

Figure 14A:
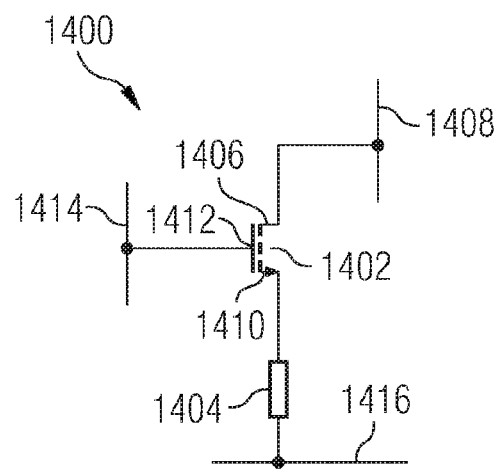
FIG. 14A shows a schematic drawing of a resistivity changing memory cell.

Resistivity changing memory cells, such as the phase changing memory cells and carbon memory cells described above, may include a transistor, diode, or other active component for selecting the memory cell. FIG. 14A shows a schematic representation of such a memory cell that uses a resistivity changing memory element. The memory cell 1400 includes a select transistor 1402 and a resistivity changing memory element 1404. The select transistor 1402 includes a source/drain area 1406 that is connected to a bit line 1408, a source/drain area 1410 that is connected to the memory element 1404, and a gate 1412 that is connected to a word line 1414. The resistivity changing memory element 1404 also is connected to a common line 1416, which may be connected to ground, or to other circuitry, such as circuitry (not shown) for determining the resistance of the memory cell 1400, for use in reading. Alternatively, in some configurations, circuitry (not shown) for determining the state of the memory cell 1400 during reading may be connected to the bit line 1408. It should be noted that as used herein the terms connected and coupled are intended to include both direct and indirect connection and coupling, respectively.

To write to the memory cell 1400, the word line 1414 is used to select the memory cell 1400, and a current (or voltage) pulse on the bit line 1408 is applied to the resistivity changing memory element 1404, changing the resistance of the resistivity changing memory element 1404. Similarly, when reading the memory cell 1400, the word line 1414 is used to select the cell 1400, and the bit line 1408 is used to apply a reading voltage (or current) across the resistivity changing memory element 1404 to measure the resistance of the resistivity changing memory element 1404.

The memory cell 1400 may be referred to as a 1T1J cell, because it uses one transistor, and one memory junction (the resistivity changing memory element 1404). Typically, a memory device will include an array of many such cells.

Figure 14B:
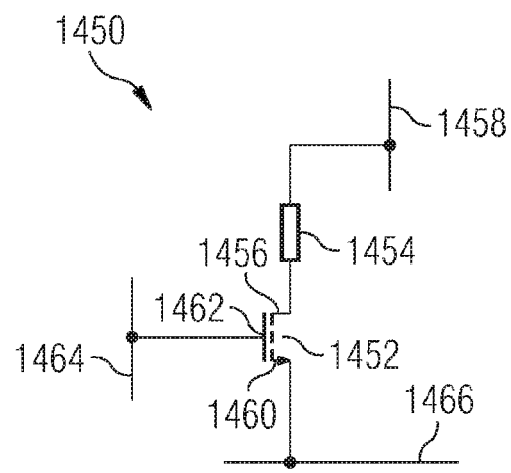
FIG. 14B shows a schematic drawing of a resistivity changing memory cell.

More generally, the memory cell 1400 may be referred to as a 1T1R cell, because it uses one transistor, and one resistive element (the resistivity changing memory element 1404). It will be understood that other configurations for a 1T1J memory cell, or configurations other than a 1T1J configuration may be used with a resistivity changing memory element. For example, in FIG. 14B, an alternative arrangement for a 1T1J memory cell 1450 is shown, in which a select transistor 1452 and a resistivity changing memory element 1454 have been repositioned with respect to the configuration shown in FIG. 14A. In this alternative configuration, the resistivity changing memory element 1454 is connected to a bit line 1458, and to a source/drain area 1456 of the select transistor 1452. A source/drain area 1460 of the select transistor 1452 is connected to a common line 1466, which may be connected to ground, or to other circuitry (not shown), as discussed above. A gate 1462 of the select transistor 1452 is controlled by a word line 1464.

As shown in FIGS. 15A and 15B, in some embodiments, integrated circuits/memory devices such as those described herein may be used in modules. In FIG. 15A, a memory module 1500 is shown, on which one or more integrated circuits/memory devices 1504 are arranged on a substrate 1502. The integrated circuits/memory devices 1504 include numerous memory cells. The memory module 1500 may also include one or more electronic devices 1506, which may include memory, processing circuitry, control circuitry, addressing circuitry, bus interconnection circuitry, or other circuitry or electronic devices that may be combined on a module with an integrated circuit/memory device, such as the integrated circuits/memory devices 1504. Additionally, the memory module 1500 includes multiple electrical connections 1508, which may be used to connect the memory module 1500 to other electronic components, including other modules.

As shown in FIG. 15B, in some embodiments, these modules may be stackable, to form a stack 1550. For example, a stackable memory module 1552 may contain one or more integrated circuits/memory devices 1556, arranged on a stackable substrate 1554. The integrated circuits/memory devices 1556 contain memory cells. The stackable memory module 1552 may also include one or more electronic devices 1558, which may include memory, processing circuitry, control circuitry, addressing circuitry, bus interconnection circuitry, or other circuitry or electronic devices that may be combined on a module with an integrated circuit/memory device, such as the integrated circuits/memory devices 1556. Electrical connections 1560 are used to connect the stackable memory module 1552 with other modules in the stack 1550, or with other electronic devices. Other modules in the stack 1550 may include additional stackable memory modules, similar to the stackable memory module 1552 described above, or other types of stackable modules, such as stackable processing modules, control modules, communication modules, or other modules containing electronic components.

In the following description, further exemplary embodiments of the present invention will be explained.

According to one embodiment of the present invention, the resistivity changing memory cells/resistivity changing reference cells are NG (Next Generation) MRAM cells.

According to one embodiment of the present invention, aging effects, temperature variations or variations due to read/write cycles of the memory cells can be tracked and compensated (if the reference cells have the same architecture as that of the memory cells, these effects also occur within reference cells; therefore, a compensation of these effects (a "synchronization" of reference cells and memory cells concerning the occurrence of these effects is possible)).

According to one embodiment of the present invention, the sense margin is adjusted by the variation of the involved capacitances, e.g., by adapting the width and length of the corresponding transistors.

According to one embodiment of the present invention, standard memory cells are used as reference memory cells. Thus, an averaging procedure or specially designed reference memory cells are dispensable.

According to one embodiment of the present invention, a single transistor instead of the two parallel connected transistors is used. The coupled voltage, occurring at the closing instant of this transistor, is used to adjust the reference voltage to a suitable value.

Within the scope of the present invention, the term "opening a switching element" means setting the switching element to a non-conductive state, and the term "closing a switching element" means setting the switching element to a conductive state, whereas the term "opening a transistor" means setting the transistor to a conductive state, and the term "closing a transistor" means setting the transistor to a non-conductive state.

FIG. 9 shows an example of a comparator configuration. The operation of this configuration is as follows: A read operation is executed in two cycles. The result of the first evaluation cycle is stored on the capacitor associated to one side of the comparator, and the result of the second evaluation cycle is stored on the second capacitor. Then the two values are compared by the comparator. To realize this, MRAM memory cells may be used which consist of two soft magnetic layers. The soft magnetic layer that is used for the data storage can only be altered by the combined current of the two perpendicular lines. The magnetization of the second soft magnetic layer is brought to a defined direction prior to the first cycle of the read operation of the memory cell resistance. This is achieved by the current of a single line. For the second cycle of the read operation, the magnetization of this second soft magnetic layer is brought to the opposite direction and the memory cell resistance is evaluated again. The result of the two memory cell evaluations, stored on the capacitances, corresponds either to a first high resistance and a second low resistance or vice versa. Thus, the memory cell provides a reference value for itself.

FIG. 3 shows that the evaluation information of a first cycle of the read operation can be stored (capacitively on the parasitic capacitances associated to the node, or a dedicated capacitance that is not shown) on node N1 while the transistor CTR is conductive. The second cycle of the read operation is executed with a closed transistor CTR (non-conductive). A comparison of the two voltages on N1 and N2 by means of the comparator yields the result of the read operation.

FIG. 3 shows an integrated circuit (MRAM configuration) according to one embodiment of the present invention. To provide a reference, a reference-wordline WLref with the corresponding reference memory cells is implemented. In a first operation WLref is activated. The result of the evaluation of the corresponding reference memory cell, which is achieved with, e.g., a multiplexer, a clamp device with voltage regulation and a load device, is stored on node N1 as described previously. In a second operation the accessed memory cell is evaluated via the identical path by activating the respective wordline WL, and the result is fed to N2. Then, the comparator evaluates the data of the memory cell by comparing the nodes N1 and N2, wherein the comparison result is fed to the output OUT. In principal, the sequence of evaluating the reference memory cell and the selected memory cell can be switched, i.e., the memory cell can be read before providing the reference. Thus, N1 would contain the memory cell information and N2 the reference. The reference may be varied over time. In this way, a multi-level memory device may be obtained.

Closing the transistor CTR couples an additional voltage to the node N1. The coupled voltage is determined by the capacitive situation found at the node N1. This effect is used according to another embodiment of the invention to adjust the reference voltage that results from reading a reference memory cell or to adjust the memory cell voltage accordingly/alternatively.

FIG. 4 shows a concrete example for this implementation. The memory cell array is connected to the read circuit by a multiplexer. The voltage on the bitline is controlled by a regulated clamp device, causing current that depends on the resistance of the memory cell. The current induces a voltage drop at the load device $R_{load}$ that can be implemented as a transistor, e.g., in diode- or current source configuration. In a first cycle, the reference memory is evaluated. The reference memory cell is a normal memory cell in the high impedance state which means that the resulting sensing current is low. The voltage drop at the load device is low and the voltage fed to N1 is close (closer than for a low impedance memory cell) to the supply voltage connected to the opposite side of the load device. The resulting voltage on N1 cannot be used directly as a reference because it would be reproduced exactly for evaluating a high impedance memory cell, thus leaving no sense margin for the comparator. The low voltage, resulting from an evaluation of a low impedance memory cell could be handled by the comparator without any problem. To transform the high voltage, corresponding to a high impedance of the reference cell, to a voltage between the voltages resulting from a high impedance memory cell and a low impedance memory cell, the above-mentioned voltage coupling is deployed. Closing the shown NFET transistor can reduce the voltage of N1 to the required value.

FIG. 5 shows a basic mechanism of the voltage coupling. A falling edge of the gate voltage CTR causes the transistor to become non-conductive. This happens at a certain voltage (usually the threshold voltage), and the remaining voltage change at the gate is coupled to N1 according to the transfer function that is determined by the implementation of the comparator and the transistor CTR. According to one embodiment of the present invention, the comparator is a CMOS type comparator, and a corresponding transfer function (the ratio between the coupling voltage and the voltage variation at the gate $V_c/V$) can be calculated, e.g., as it is shown in FIG. 6 with a small signal equivalent circuit $|V_c/V|=c_{ovlapCTR}/c_{ovlapCTR}+c_{lump}$. The transfer function and the values of $c_{ovlapCTR}$ and $c_{lump}$ depend on the comparator type and the sizing of the transistors (width and length), respectively. Therefore, the coupling voltage can be adjusted exactly to the desired value.

FIG. 8 shows a further embodiment of an integrated circuit. In this example, a PMOS type transistor CTR is used. Since PMOS type transistors are low-active, a rising edge can close the device. The voltage that is coupled by a rising edge increases the voltage at node N1. For an implementation according to FIG. 4, a low impedance memory cell may be used as a reference memory cell. The resulting low voltage at N1 for the activation of the reference wordline WLref can be transformed to a suitable voltage by closing the PMOS transistor CTR in a similar manner as described in previous embodiments.

According to one embodiment of the present invention, the position of the clamp device and the load device in FIG. 4 are exchanged (in this embodiment, the clamp transistor has to be implemented as PMOS transistor). In this embodiment, a PMOS type transistor CTR is combined with a high impedance reference memory cell. For an NMOS transistor CTR, a low impedance reference memory cell should be used, accordingly.

One effect of the discussed embodiments is that aging effects, temperature variations and cycling effects, etc., of the memory cells can be tracked by the reference memory cells. At the same time the read margin for a high or low impedance memory cell can be adjusted by tuning the coupling voltage. An averaging procedure or the implementation of special reference memory cells is not required. The reference memory cells are standard high or low impedance memory cells attached to the wordline WLref. Compared to the integrated circuit shown in FIG. 9, the transistor count can be reduced.

All embodiments discussed above may also be applied to multi-level memory devices. To do so, the reference memory cells may be implemented as memory cells corresponding to a certain level. Several wordlines, WLref, can be provided for different levels. The capacitive correction of the voltage on N1 may be done in an analog way as described. To read a multi-level memory cell, several sequential comparisons can be executed. An equivalent approach can be provided with a parallel implementation.

According to one embodiment of the present invention, a normal memory cell, programmed to a regular memory value, can be used as reference cell. No averaging between several memory cells (e.g., a high and low impedance memory cells) or special memory cells (e.g., larger or smaller than a usual memory cell) are required.

According to one embodiment of the present invention, the load device is, e.g., a transistor in current source or a diode configuration.

According to one embodiment of the present invention, the transfer function depends on the implementation of the voltage comparator 201 and the switching element 206 and can be equivalent to the capacitive voltage divider shown in FIG. 6.

According to one embodiment of the present invention, the coupled voltage can be adjusted. For example, the adjustment can be done according to $|v_c/v|=c_{ovlapCTR}/c_{ovlapCTR}+c_{lump})$, wherein $c_{ovlapCTR}$ and $c_{lump}$ are functions of the width and length of the transistor CTR and the comparator transistors (depending on the implementation of the comparator).

According to one embodiment of the present invention, a low impedance memory cell is used as a reference.

According to one embodiment of the present invention, a positive shift of the voltage is required when closing the transistor CTR, which can be achieved by closing a PMOS device transistor. The PMOS transistor closes with a rising edge and the coupled voltage is also in a positive direction. The load device and the clamp device change their position (the clamp device includes a PMOS), and a high impedance reference memory cell is combined with the PMOS CTR transistor.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit, comprising:
    a plurality of resistivity changing memory cells and at least one resistivity changing reference cell;
    a voltage comparator comprising a first input terminal and a second input terminal;
    a signal line being connected to the plurality of resistivity changing memory cells, the at least one resistivity changing reference cell, and the second input terminal; and
    a switching element directly connecting the first input terminal to the second input terminal.

2. The integrated circuit according to claim 1, wherein the integrated circuit is configured to carry out the following:
   a) closing the switching element;
   b) supplying a first voltage to the first input terminal via the signal line and the switching element;
   c) opening the switching element;
   d) supplying a second voltage to the second input terminal via the signal line; and
   e) comparing the first voltage and the second voltage using the voltage comparator, wherein the first voltage represents a memory state of a resistivity changing memory cell, and the second voltage is a reference voltage which represents a memory state of a resistivity changing reference cell, or vice versa.

3. The integrated circuit according to claim 2, wherein capacitive coupling properties of the switching element are useable to change the first voltage supplied by the signal line to the first input terminal to a third voltage, wherein the value of the third voltage differs from the value of the first voltage.

4. The integrated circuit according to claim 3, wherein dimensions and/or electrical properties of the switching element, are chosen such that the voltage comparator is capable of detecting a voltage difference between the second voltage and the third voltage resulting from the dimensions and/or electrical properties.

5. The integrated circuit according to claim 1, wherein the reference cell and the memory cells have the same physical architecture.

6. The integrated circuit according to claim 1, wherein the switching element comprises a transistor.

7. The integrated circuit according to claim 2, wherein the resistivity changing memory cells comprise multi-level resistivity changing memory cells.

8. The integrated circuit according to claim 7, wherein the integrated circuit is configured to compare the first voltage against several second voltages by keeping the first voltage at the first input terminal constant, and by varying the second voltage at the second input terminal.

9. The integrated circuit according to claim 8, wherein each second voltage supplied to the second input terminal represents a different reference voltage.

10. The integrated circuit according to claim 1, wherein the at least one reference cell comprises a multi-level resistivity changing reference cell.

11. The integrated circuit according to claim 1, wherein at least one of the resistivity changing memory cells and the resistivity changing reference cell are the same resistivity changing cell, wherein the integrated circuit is configured such that a first voltage is obtained by reading out a first memory state of a resistivity changing cell, and a second voltage is obtained by reprogramming the first memory state of the resistivity changing cell to a second memory state, and reading out the second memory state.

12. A memory module comprising at least one integrated circuit comprising:
   a plurality of resistivity changing memory cells and at least one resistivity changing reference cell;
   a voltage comparator comprising a first input terminal and a second input terminal;
   a signal line being connected to the resistivity changing memory cells, the at least one resistivity changing reference cell, and the second input terminal; and
   a switching element directly connecting the first input terminal to the second input terminal.

13. The memory module according to claim 12, wherein the memory module is stackable.

14. A method of operating an integrated circuit, the integrated circuit comprising:
   a plurality of resistivity changing memory cells and at least one resistivity changing reference cell;
   a voltage comparator comprising a first input terminal and a second input terminal;
   a signal line being connected to the plurality of resistivity changing memory cells, the at least one resistivity changing reference cell, and the second input terminal; and
   a switching element directly connecting the first input terminal to the second input terminal, the method comprising:
   a) closing the switching element;
   b) supplying a first voltage to the first input terminal via the signal line and the switching element;
   c) opening the switching element;
   d) supplying a second voltage to the second input terminal via the signal line; and
   e) comparing the first voltage and the second voltage using the voltage comparator, wherein the first voltage represents a memory state of a resistivity changing memory cell, and the second voltage is a reference voltage which represents a memory state of a resistivity changing reference cell, or vice versa.

15. The method according to claim 14, wherein capacitive coupling effects of the switching element are used to change the first voltage supplied by the signal line to the first input terminal to a third voltage, wherein the value of the third voltage differs from the value of the first voltage.

16. The method according to claim 15, wherein the third voltage is chosen such that the voltage comparator is capable of detecting a voltage difference between the second voltage and the third voltage.

17. The method according to claim 16, wherein the strength of the capacitive coupling effects are controlled by dimensions and/or electrical properties of the switching element.

18. The method according to claim 14, wherein the at least one reference cell and the memory cells have the same physical architecture.

19. The method according to claim 14, wherein the switching element comprises a transistor.

20. The method according to claim 14, wherein the resistivity changing memory cells comprise multi-level resistivity changing memory cells.

21. The method according to claim 20, wherein the first voltage is compared against several second voltages by keeping the first voltage at the first input terminal constant, and by varying the second voltage at the second input terminal.

22. The method according to claim 21, wherein each second voltage supplied to the second input terminal represents a different reference voltage.

23. The method according to claim 22, wherein the at least one reference cell comprises a multi-level resistivity changing reference cell.

24. The method according to claim 14, wherein at least one of the resistivity changing memory cells and the resistivity changing reference cell are the same resistivity changing cell, wherein the first voltage is obtained by reading out a first memory state of the resistivity changing cell, and the second voltage is obtained by reprogramming the first memory state of the resistivity changing cell to a second memory state, and reading out the second memory state.

* * * * *